US011430763B2

(12) United States Patent
Choi et al.

(10) Patent No.: US 11,430,763 B2
(45) Date of Patent: Aug. 30, 2022

(54) SEMICONDUCTOR PACKAGES INCLUDING STACK MODULES COMPRISED OF INTERPOSING BRIDGES AND SEMICONDUCTOR DIES

(71) Applicant: SK hynix Inc., Icheon-si (KR)

(72) Inventors: Bok Kyu Choi, Yongin-si (KR); Kyoung Tae Eun, Seoul (KR)

(73) Assignee: SK hynix Inc., Icheon-si (KR)

( * ) Notice: Subject to any disclaimer, the term of this patent is extended or adjusted under 35 U.S.C. 154(b) by 161 days.

(21) Appl. No.: 16/984,854

(22) Filed: Aug. 4, 2020

(65) Prior Publication Data

US 2021/0265307 A1  Aug. 26, 2021

(30) Foreign Application Priority Data

Feb. 24, 2020 (KR) ........................ 10-2020-0022474

(51) Int. Cl.
| H01L 25/065 | (2006.01) |
|---|---|
| H01L 23/498 | (2006.01) |
| H01L 25/18 | (2006.01) |
| H01L 23/00 | (2006.01) |

(52) U.S. Cl.
CPC .... *H01L 25/0652* (2013.01); *H01L 23/49827* (2013.01); *H01L 23/49838* (2013.01); *H01L 24/20* (2013.01); *H01L 24/82* (2013.01); *H01L 25/18* (2013.01)

(58) Field of Classification Search
CPC ........... H01L 25/0652; H01L 23/49827; H01L 23/49838; H01L 25/18; H01L 24/82
See application file for complete search history.

(56) References Cited

U.S. PATENT DOCUMENTS

| 11,233,002 B2* | 1/2022 | Martorell | ............ H01L 25/0655 |
| 2018/0012867 A1* | 1/2018 | Kim | ........................ H01L 25/18 |
| 2020/0075490 A1* | 3/2020 | Sung | ........................ H01L 24/73 |

FOREIGN PATENT DOCUMENTS

| KR | 101046252 B1 | 7/2011 |
| KR | 1020170064217 A | 6/2017 |

* cited by examiner

*Primary Examiner* — Phat X Cao
(74) *Attorney, Agent, or Firm* — William Park & Associates Ltd.

(57) ABSTRACT

A semiconductor package includes a plurality of stack modules which are vertically stacked. Each of the stack modules includes an interposing bridge, a semiconductor dies, and redistribution lines. The stack modules are provided by rotating each of the stack modules by different rotation angles corresponding to multiples of a reference angle and by vertically stacking the rotated stack modules. The interposing bridge includes a plurality of sets of through vias, and each set of through vias includes through vias arrayed in a plurality of columns. The plurality of sets of through vias are disposed in respective ones of divided regions of the interposing bridge. If the plurality of sets of through vias are rotated by the reference angle, then the rotated through vias overlap with the plurality of sets of through vias which are originally located. The redistribution lines connect the semiconductor dies to the plurality of sets of through vias.

20 Claims, 12 Drawing Sheets

FIG. 8
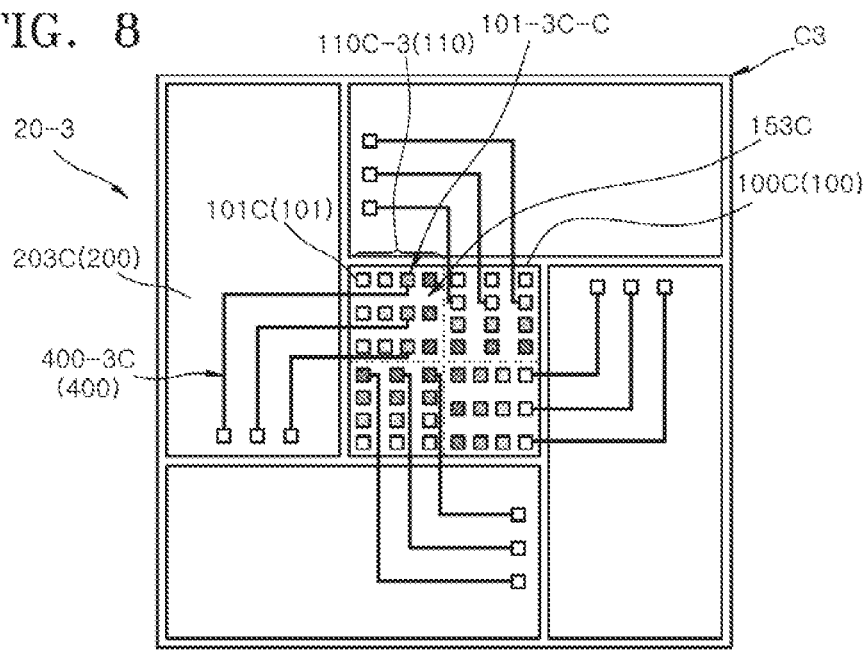
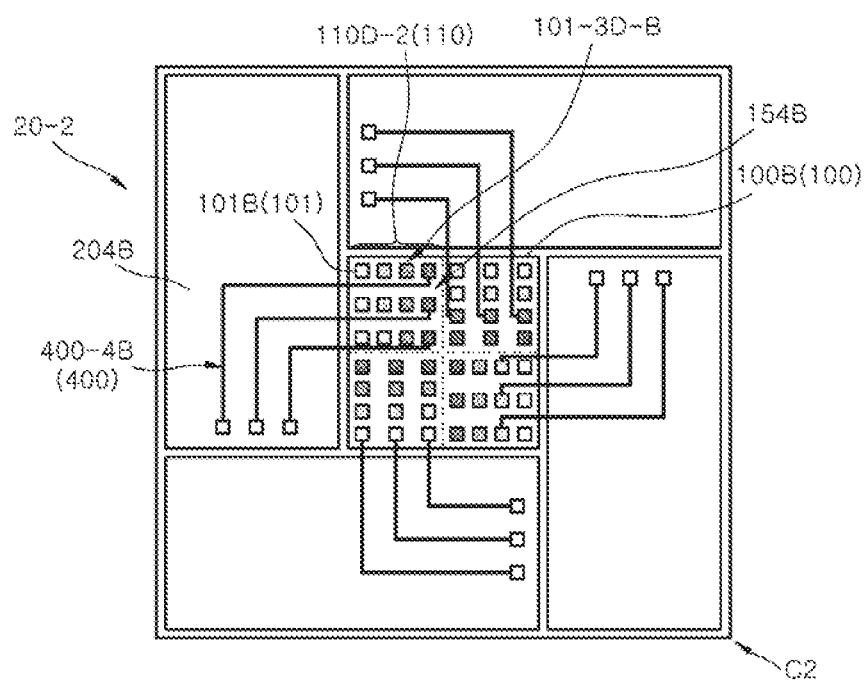

FIG. 9
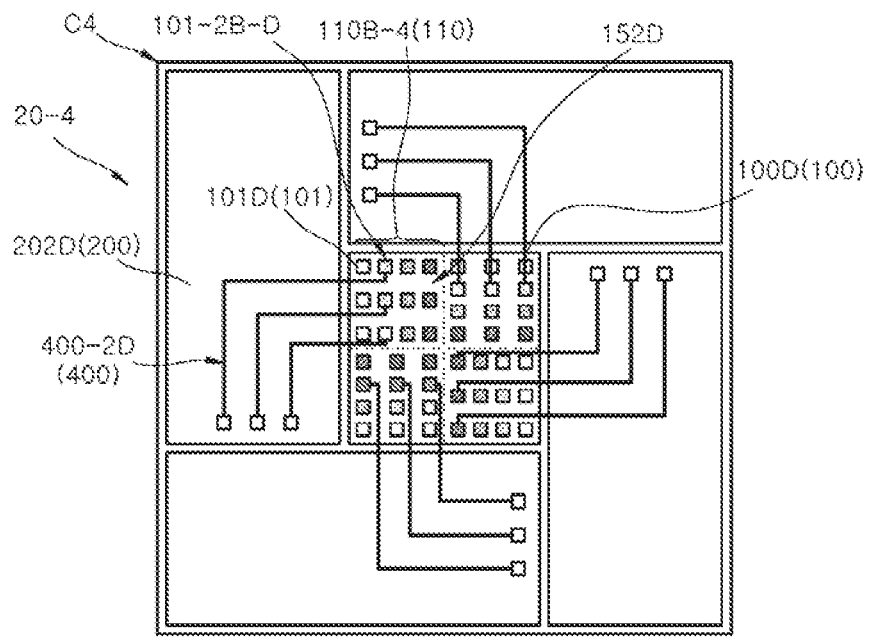
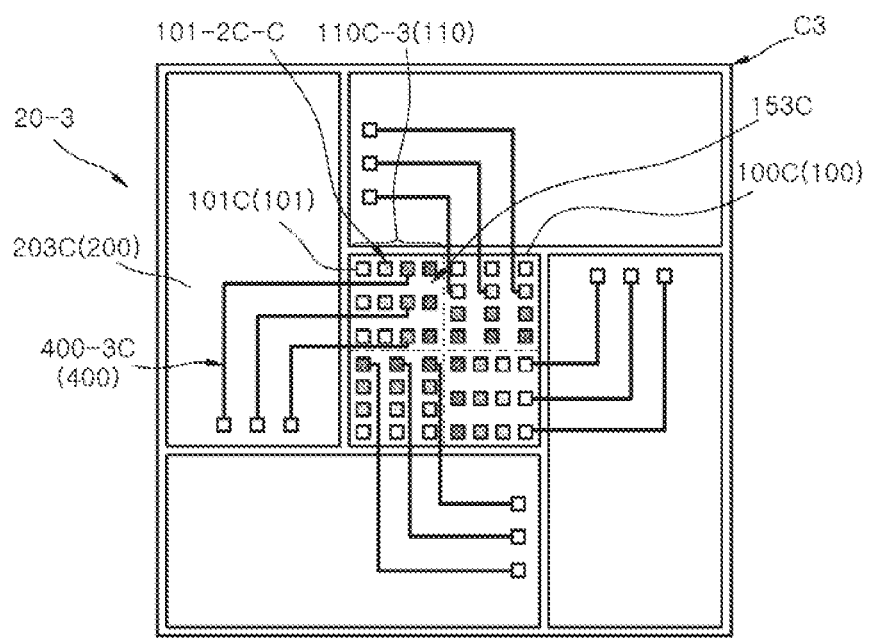

SEMICONDUCTOR PACKAGES INCLUDING STACK MODULES COMPRISED OF INTERPOSING BRIDGES AND SEMICONDUCTOR DIES

CROSS-REFERENCE TO RELATED APPLICATIONS

The present application claims priority under 35 U.S.C 119(a) to Korean Application No. 10-2020-0022474, filed on Feb. 24, 2020, which is incorporated herein by references in its entirety.

BACKGROUND

1. Technical Field

The present disclosure relates to semiconductor package technologies and, more particularly, to semiconductor packages including stacked modules with interposing bridges and semiconductor dies.

2. Related Art

Recently, a lot of effort has been focused on integrating a plurality of semiconductor dies into one semiconductor package. That is, attempts to increase package integration density have been made to realize high performance semiconductor packages that process a large amount of data at a high speed. The plurality of semiconductor dies included in each semiconductor package may be vertically and/or laterally disposed. In the event that the plurality of semiconductor dies is disposed in one semiconductor package, it may be necessary to employ an interconnection structure for designating a specific semiconductor die.

SUMMARY

According to an embodiment, a semiconductor package includes a plurality of stack modules which are vertically stacked by rotating each of the stack modules by different rotation angles corresponding to multiples of a reference angle with respect to a rotation axis of the stack modules and by vertically and sequentially stacking the rotated stack modules. Each of the plurality of stack modules includes an interposing bridge, a plurality of semiconductor dies disposed at a periphery region of the interposing bridge, redistribution lines connecting the plurality of semiconductor dies to the interposing bridge. The interposing bridge includes an interposing bridge body and a plurality of sets of through vias. The interposing bridge body is configured to include a plurality of divided regions, and each of the plurality of divided regions is divided by the reference angle using the rotation axis as a reference axis in a plan view. The plurality of sets of through vias are disposed to penetrate the interposing bridge body and arrayed in a plurality of columns in a plan view. The plurality of sets of through vias are rotated by the different rotation angles and are disposed in respective ones of the plurality of divided regions. The redistribution lines are disposed to connect the plurality of sets of through vias to respective ones of the semiconductor dies. The columns in which the through vias connected to the redistribution lines are arrayed are different according to the plurality of divided regions.

According to another embodiment, a semiconductor package includes first to fourth stages of stack modules which are vertically stacked by rotating each of the stack modules by different rotation angles corresponding to multiples of 90 degrees with respect to a rotation axis of the stack modules and by vertically and sequentially stacking the rotated stack modules. Each of the first to fourth stages of stack modules includes an interposing bridge, first to fourth semiconductor dies disposed to surround the interposing bridge such that side surfaces of the first to fourth semiconductor dies face each other, and first to fourth groups of redistribution lines disposed to connect the first to fourth semiconductor dies to the interposing bridge. The interposing bridge includes an interposing bridge body and first to fourth sets of through vias. The interposing bridge body is configured to include first to fourth divided regions, and each of the first to fourth divided regions is divided by 90 degrees using the rotation axis as a reference axis in a plan view. The first to fourth sets of through vias are disposed in respective ones of the first to fourth divided regions and arrayed in four different array directions according the divided regions. Each of the first to fourth sets of through vias are arrayed in a plurality of columns and an angle between the four different array directions is 90 degrees. The first to fourth sets of through vias are disposed in the first to fourth divided regions, respectively. Columns in which the through vias connected to the first to fourth redistribution lines are arrayed are different according to the plurality of divided regions.

According to yet another embodiment, a semiconductor package includes a plurality of stack modules which are vertically stacked by rotating each of the stack modules by different rotation angles corresponding to multiples of a reference angle with respect to a rotation axis of the stack modules and by vertically and sequentially stacking the rotated stack modules. Each of the plurality of stack modules includes a plurality of semiconductor dies disposed to have a rim-shaped form, a plurality of interposing bridges disposed to be adjacent to respective ones of the semiconductor dies, and redistribution lines connecting the plurality of semiconductor dies to respective ones of the plurality of interposing bridges. Each of the interposing bridges includes an interposing bridge body and a plurality of through vias. The plurality of through vias are disposed to penetrate the interposing bridge body and arrayed in a plurality of columns in a plan view. If the interposing bridges are rotated by the reference angle with respect to the rotation axis, then the rotated interposing bridges overlap with the interposing bridges which are originally located. The redistribution lines are disposed to connect the interposing bridges to respective ones of the semiconductor dies. The columns in which the through vias connected to the redistribution lines are arrayed are different according to the interposing bridges.

According to still another embodiment, a semiconductor package includes first to fourth stages of stack modules which are vertically stacked by rotating each of the stack modules by different rotation angles corresponding to multiples of 90 degrees with respect to a rotation axis of the stack modules and by vertically and sequentially stacking the rotated stack modules. Each of the first to fourth stages of stack modules includes first to fourth semiconductor dies disposed to have a rim-shaped form, first to fourth interposing bridges disposed to be adjacent to respective ones of the first to fourth semiconductor dies such that side surfaces of the first to fourth interposing bridges face side surfaces of the first to fourth semiconductor dies, and redistribution lines connecting the first to fourth of semiconductor dies to respective ones of the first to fourth of interposing bridges. Each of the first to fourth interposing bridges includes an interposing bridge body and through vias. The through vias are disposed to penetrate the interposing bridge body and arrayed in first to fourth columns. If the first to fourth interposing bridges are rotated by 90 degrees with respect to the rotation axis, then the rotated first to fourth interposing bridges overlap with the first to fourth interposing bridges which are originally located. The redistribution lines are disposed to connect the first to fourth interposing bridges to respective ones of the first to fourth semiconductor dies. The columns in which the through vias connected to the redistribution lines are arrayed are different according to the interposing bridges.

BRIEF DESCRIPTION OF THE DRAWINGS

FIG. 8 is a plan view illustrating through vias and redistribution lines of a second stage of a stack module and a third stage of a stack module included in the semiconductor package illustrated in FIG. 6.

FIG. 9 is a plan view illustrating through vias and redistribution lines of a third stage of a stack module and a fourth stage of a stack module included in the semiconductor package illustrated in FIG. 6.

DETAILED DESCRIPTION OF THE EMBODIMENTS

Figure 1:
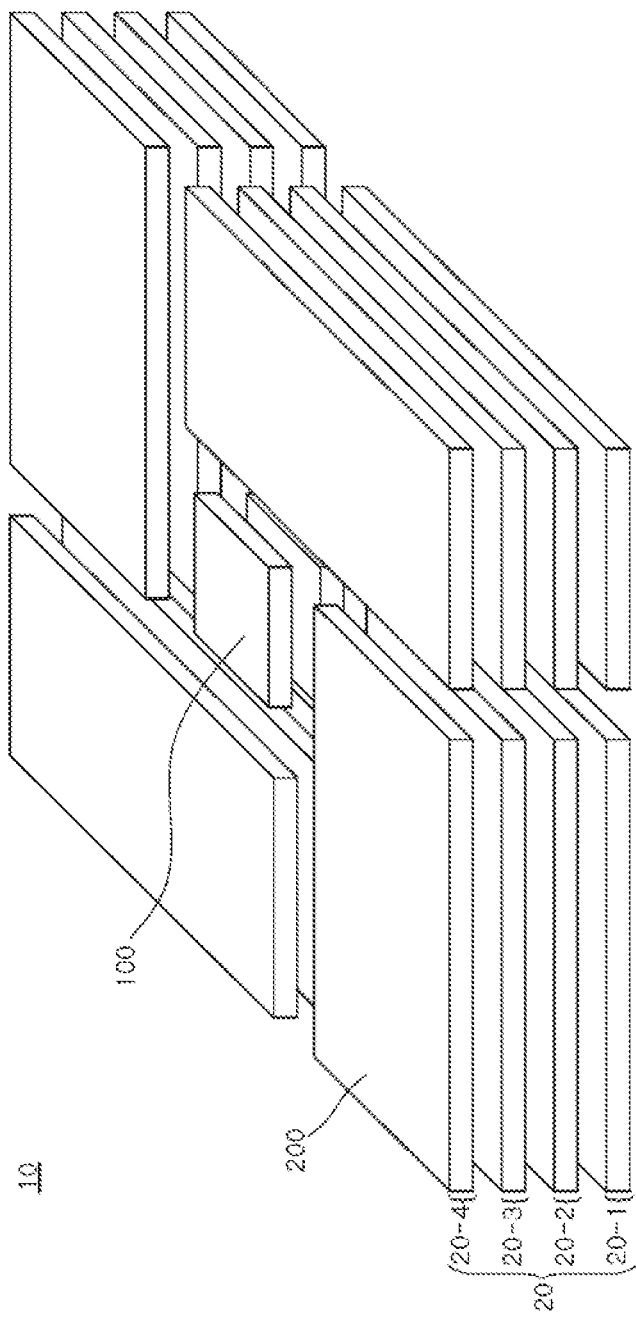
FIG. 1 is a perspective view illustrating a semiconductor package according to an embodiment.

The terms used herein may correspond to words selected in consideration of their functions in presented embodiments, and the meanings of the terms may be construed to be different according to one of ordinary skill in the art to which the embodiments belong. If defined in detail, then the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third," etc. may be used herein to describe various elements, these elements should not be limited by these terms. These terms are only used to distinguish one element from another element, and are not used to indicate a number of elements or a particular sequence of elements.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom," and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

In the following embodiments, a semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips, application specific integrated circuits (ASIC) chips, application processors (APs), graphic processing units (GPUs), central processing units (CPUs) or system-on-chips (SoCs). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems. The semiconductor packages may be applicable to internet of things (IoT).

Same reference numerals refer to same elements throughout the specification. Even though a reference numeral is not indicated or described with reference to a drawing, the reference numeral may be indicated or described with reference to another drawing. In addition, even though a reference numeral is not shown in a drawing, it may be indicated or described with reference to another drawing.

FIG. 1 is a perspective view illustrating a semiconductor package 10 according to an embodiment.

Referring to FIG. 1, the semiconductor package 10 may be configured to include a plurality of stack modules 20 which are vertically stacked. In an embodiment, the semiconductor package may be configured to include four stack modules (i.e., first to fourth stage of stack modules 20-1, 20-2, 20-3, and 204) which are vertically stacked. In such a case, the second, third, and fourth stages of stack modules 20-2, 20-3, and 20-4 may be sequentially stacked on the first stage of stack module 20-1. In another embodiment, at least one additional stack module may be stacked on the fourth stage of stack module 20-4. The first to fourth stages of stack modules 20-1, 20-2, 20-3, and 20-4 may be realized to have substantially the same configuration.

Figure 2:
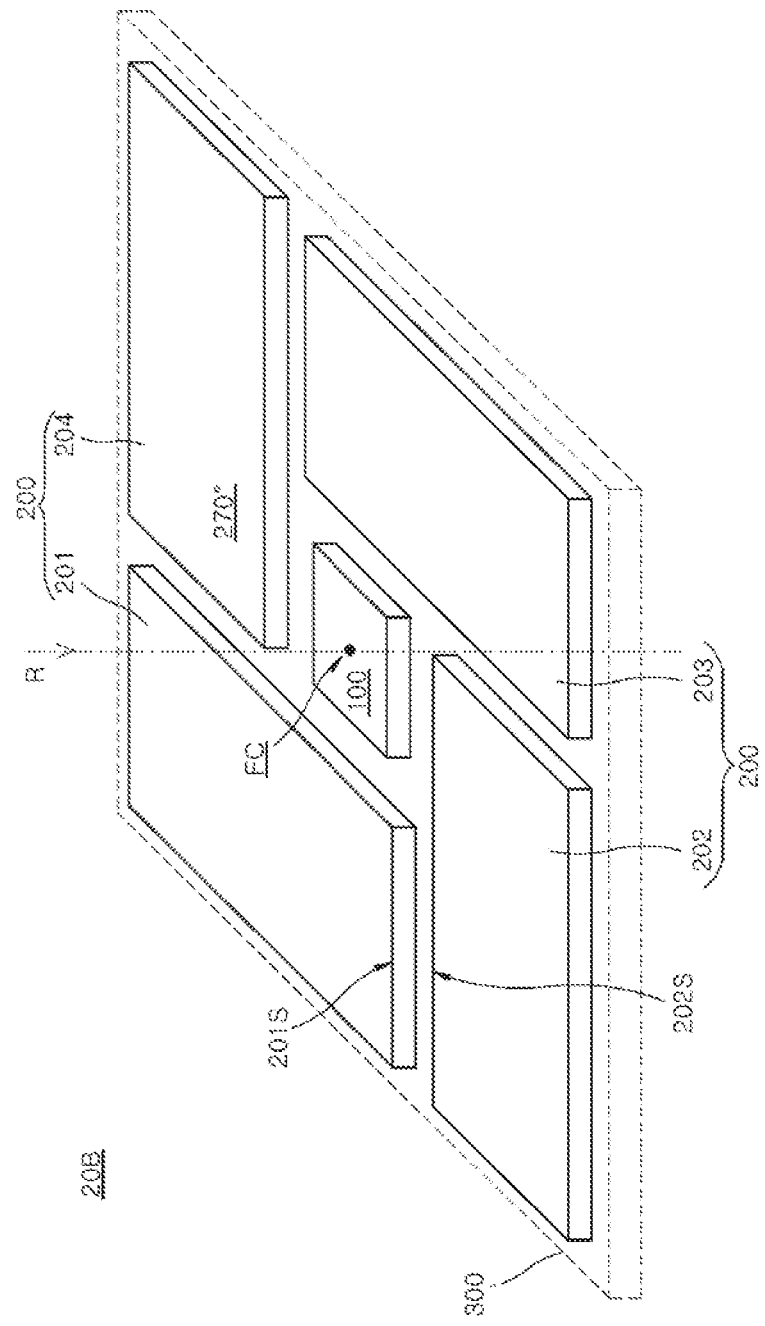
FIG. 2 is a perspective view illustrating a unit stack module of a semiconductor package according to an embodiment.

FIG. 2 is a perspective view illustrating a unit stack module 20B according to an embodiment.

Referring to FIGS. 1 and 2, each of the plurality of stack modules 20 constituting the semiconductor package 10 may have the same configuration as the unit stack module 20B. That is, each of the first to fourth stages of stack modules 20-1, 20-2, 20-3, and 20-4 may have the same configuration as the unit stack module 20B. The unit stack module 20B may be provided as a basic unit, a basic element, or a basic sub-package which is able to be stacked.

The unit stack module 20B may be configured to include an interposing bridge 100 and a plurality of semiconductor dies 200 as basic elements. The unit stack module 20B may further include an encapsulant 300. The encapsulant 300 may act as a base layer for binding and integrating the interposing bridge 100 and the plurality of semiconductor dies 200 in one modularized member. The encapsulant 300 may be molded to embed the interposing bridge 100 and the plurality of semiconductor dies 200 therein. The encapsulant 300 may be formed using at least one of various encapsulating materials. The encapsulant 300 may be formed by molding an epoxy molding compound (EMC) material. In FIG. 1, each of the plurality of stack modules 20 is illustrated without the encapsulant 300 for the purpose of ease and convenience in explanation.

Referring to FIG. 2, the semiconductor dies 200 of the unit stack module 20B may be disposed in a pinwheel form. That is, the plurality of semiconductor dies 200 may be disposed at a periphery region of the interposing bridge 100. The plurality of semiconductor dies 200 may be disposed to have a rim-shaped form surrounding side surfaces of the interposing bridge 100 such that side surfaces of the plurality of semiconductor dies 200 face each other. For example, the plurality of semiconductor dies 200 (i.e., first to fourth semiconductor dies 201, 202, 203, and 204) may be disposed to surround the side surfaces of the interposing bridge 100 when viewed from a plan view. The first to fourth semiconductor dies 201, 202, 203, and 204 may have substantially the same configuration and the same function. The first to fourth semiconductor dies 201, 202, 203, and 204 may be memory semiconductor dies.

The first semiconductor die 201 may be disposed to be adjacent to the second semiconductor die 202 such that a side surface 201S of the first semiconductor die 201 faces a side surface 202S of the second semiconductor die 202. The side surface 201S of the first semiconductor die 201 may have a length which is less than a length of the side surface 202S of the second semiconductor die 202. The second semiconductor die 202 may be disposed to overlap with the first semiconductor die 201 which is rotated by 90 degrees in a counterclockwise direction with respect to a rotation axis R in a plan view. Similarly, the third, fourth, and first semiconductor dies 203, 204, and 201 may be disposed to overlap with respective ones of the second, third, and fourth semiconductor dies 202, 203, and 204 which are rotated by 90 degrees in a counterclockwise direction with respect to the rotation axis R in a plan view. That is, if the first to fourth semiconductor dies 201, 202, 203, and 204 are rotated by 90 degrees with respect to the rotation axis R in a counterclockwise direction in a plan view, then the first, second, third, and fourth semiconductor dies 201, 202, 203, 204 may move to places where the second, third, fourth, and first semiconductor dies 202, 203, 204, and 201 are originally located, respectively. The rotation axis R may be an axis that vertically passes through a faced center FC of a planar surface of the unit stack module.

Figure 3:
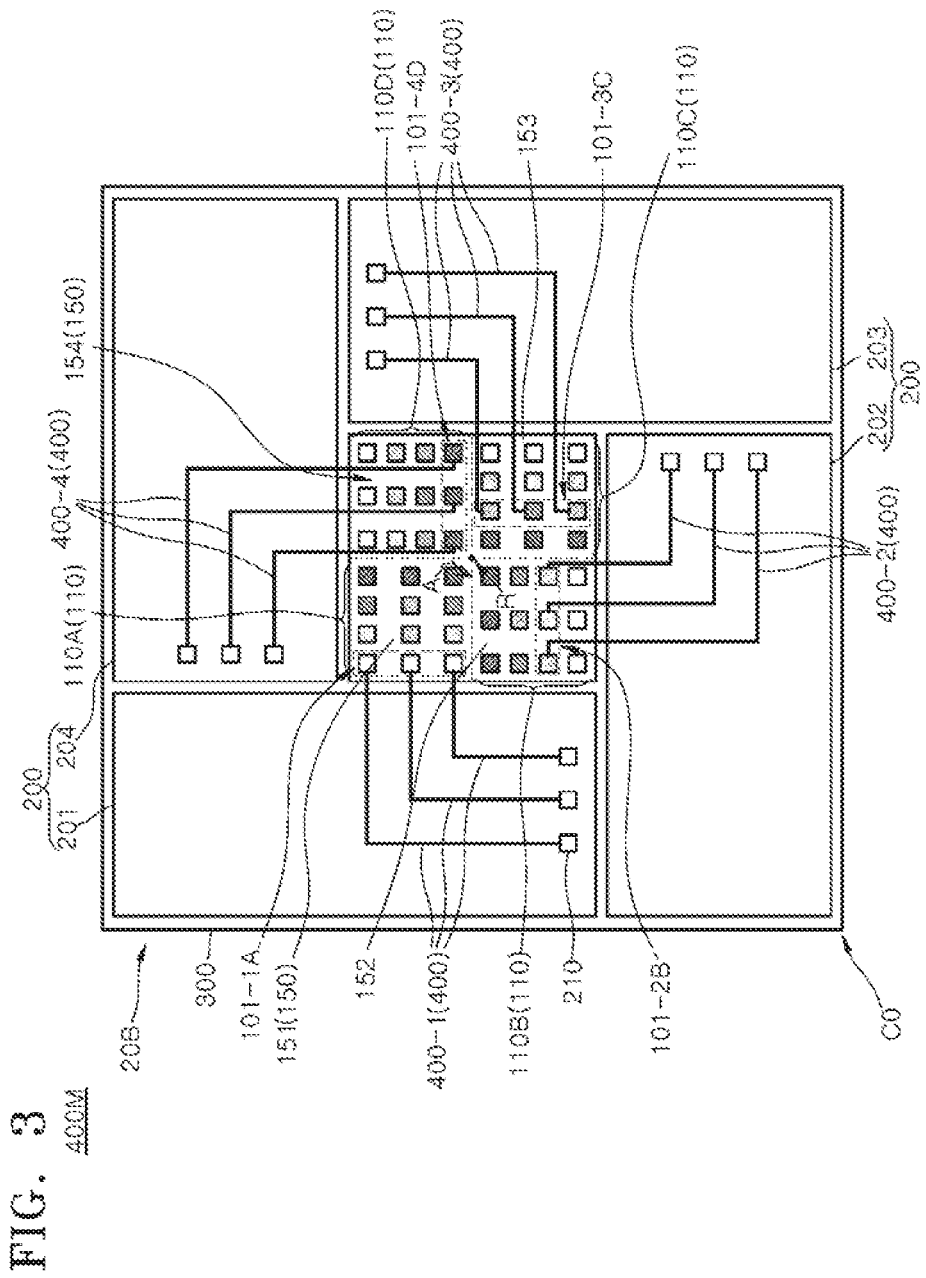
FIG. 3 is a plan view illustrating redistributed lines disposed in the unit stack module illustrated in FIG. 2.

FIG. 3 is a plan view illustrating a layout 400M of redistribution lines (RDLs) 400 included in the unit stack module 20B illustrated in FIG. 2.

Referring to FIG. 3, the unit stack module 20B may be configured to further include the redistribution lines 400 disposed on a surface of a body of the unit stack module 20B. The redistribution lines 400 may be formed of conductive patterns to connect semiconductor dies 200 to the interposing bridge 100. The conductive patterns used as the redistribution lines 400 may be formed to extend from surfaces of the semiconductor dies 200 onto a surface of the interposing bridge 100. The redistribution lines 400 may be disposed to connect chip pads 210 disposed on surfaces of the semiconductor dies 200 to through vias 101 disposed in the interposing bridge 100.

Figure 4:
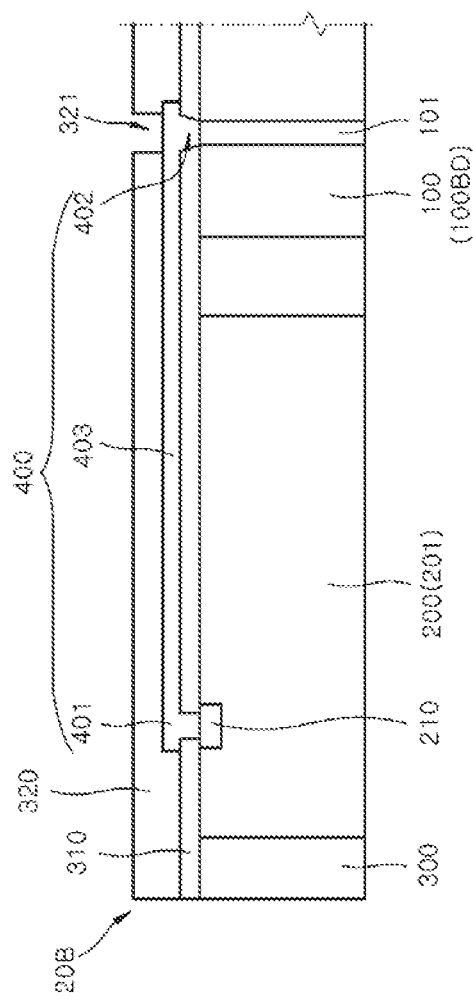
FIG. 4 is a cross-sectional view illustrating one of the redistributed lines illustrated in FIG. 3.

FIG. 4 is a cross-sectional view taken along any one of the redistributed lines 400 of the unit stack module 20B illustrated in FIG. 3.

Referring to FIG. 4, the unit stack module 20B may further include a first dielectric layer 310 formed to cover a surface of the semiconductor die 200, a surface of the interposing bridge 100, and a surface of the encapsulant 300. The redistributed line 400 may be formed on a surface of the first dielectric layer 310 opposite to the semiconductor dies 200. The redistributed line 400 may be a conductive pattern including a first overlap portion 401, a second overlap portion 402, and an extension portion 403 connecting the first overlap portion 401 to the second overlap portion 402. The first overlap portion 401 of the redistribution line 400 may penetrate the first dielectric layer 310 to contact the chip pad 210 of the semiconductor die 200 such that the redistribution line 400 is electrically connected to the semiconductor die 200. The second overlap portion 402 of the redistribution line 400 may penetrate the first dielectric layer 310 to be connected to one of the through vias 101 of the interposing bridge 100. In FIG. 3, it will be understood that the first overlap portions 401, the second overlap portions 402, and the extension portions 403 of the redistribution lines 400 are not indicated for the purpose of ease and convenience in explanation.

The unit stack module 20B may further include a second dielectric layer 320 which is formed to cover and insulate the redistribution line 400. The second dielectric layer 320 may be formed to provide an opening 321 revealing the second overlap portion 402 of the redistribution line 400. The second overlap portion 402 of the redistribution line 400 revealed by the opening 321 may be electrically connected to a through via of another stack module.

The interposing bridge 100 may be configured to include an interposing bridge body 100BD and the through vias 101 vertically penetrating the interposing bridge body 100BD. The interposing bridge body 100BD may correspond to a silicon die. The through vias 101 may be formed to include a metal material such as a copper material. The through vias 101 may be formed using a through silicon via (TSV) technique.

Figure 5:
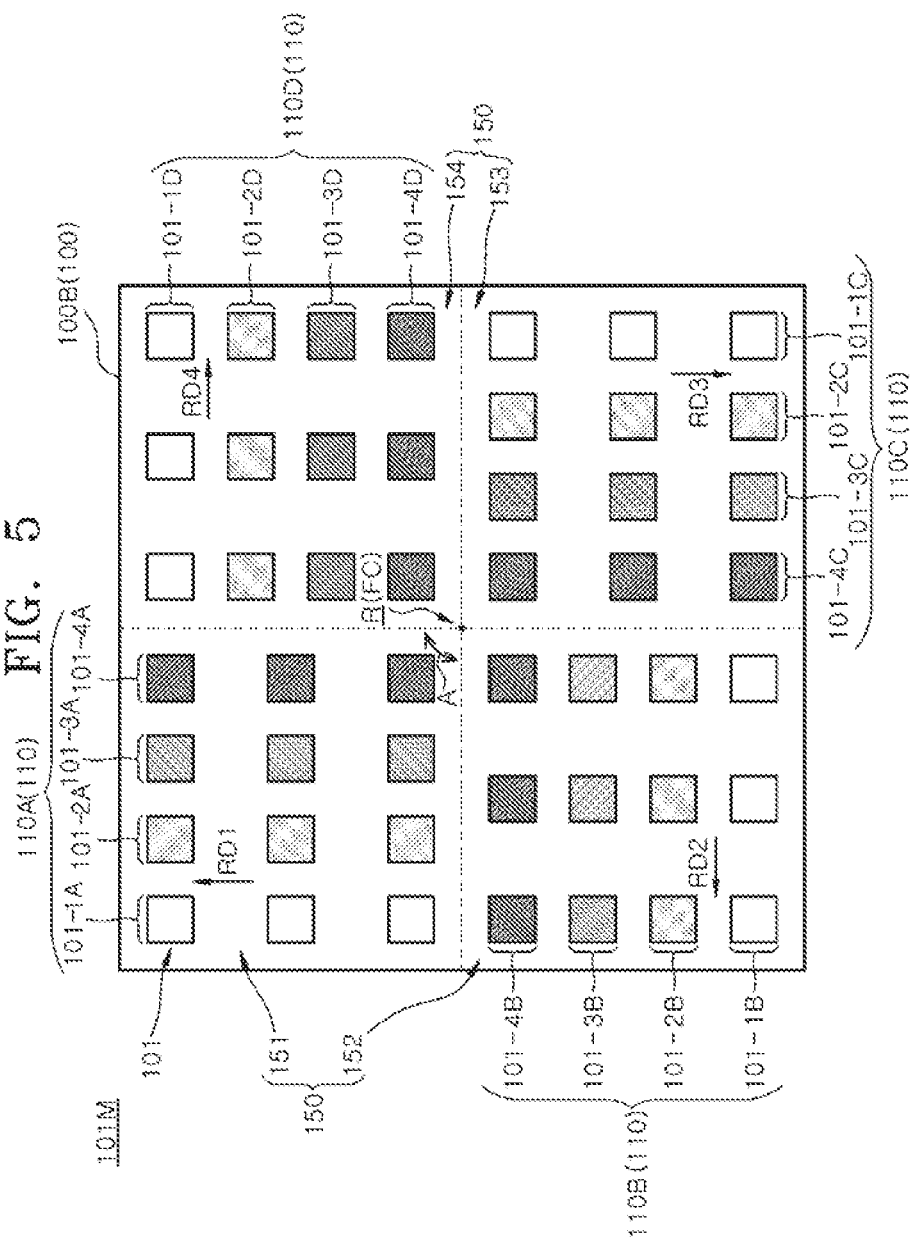
FIG. 5 is a plan view illustrating through vias disposed in an interposing bridge of FIG. 3.

FIG. 5 is a plan view illustrating a layout 101M of the through vias 101 disposed in the interposing bridge 100 illustrated in FIG. 3.

Referring to FIG. 5, the interposing bridge body 100BD may have a polygonal shape, for example, a tetragonal shape when viewed from a plan view. The interposing bridge body 100BD may include a plurality of divided regions 150. The divided regions 150 may be regions, each of which is divided by a certain reference angle A using the rotation axis R as a reference axis in a plan view. For example, the divided regions 150 may include first, second, third, and fourth divided regions 151, 152, 153, and 154. The first, second, third, and fourth divided regions 151, 152, 153, and 154 may correspond to four quadrantal regions of the interposing bridge body 100BD, each of which is divided by 90 degrees using the rotation axis R as a reference axis in a plan view.

Referring to FIGS. 3 and 5, the divided regions 150 may be regions corresponding to the semiconductor dies 200, respectively. As illustrated in FIG. 3, if the four semiconductor dies 200 are disposed at the periphery region of the interposing bridge 100, then the interposing bridge 100 may be divided into the four divided regions 150 that correspond to the four semiconductor dies 200, respectively. That is, if the first to fourth semiconductor dies 201, 202, 203, and 204 are disposed at the periphery region of the interposing bridge 100, then the interposing bridge 100 may be divided into the first, second, third, and fourth divided regions 151, 152, 153, and 154, the number of which are equal to the number of the first to fourth semiconductor dies 201, 202, 203, and 204.

Referring again to FIG. 5, a set of through vias 110 may be disposed in each of the divided regions 150. The set of through vias 110 may denote a group of the through vias 101 disposed in each of the divided regions 150. Each of the sets of through vias 110 (i.e., first to fourth sets of through vias 110A, 110B, 110C, and 110D) disposed in the first to fourth divided regions 151, 152, 153, and 154 may be configured to include the through vias 101 located at cross points of a plurality of rows and a plurality of columns. A row direction and a column direction may be set to be different according to the divided regions 150.

The first set of through vias 110A may be disposed in the first divided region 151 of the interposing bridge 100. The first set of through vias 110A may be configured to include the through vias 101 arrayed in first, second, third, and fourth columns 101-1A, 101-2A, 101-3A, and 101-4A. The first, second, third, and fourth columns 101-1A, 101-2A, 101-3A, and 101-4A in which the first set of through vias 110A are arrayed may be parallel with a first array direction RD1.

The second set of through vias 110B may be disposed in the second divided region 152 of the interposing bridge 100, and all of the second set of through vias 110B may be arrayed in a second array direction RD2. The second set of through vias 110B may be configured to include the through vias 101 arrayed in first, second, third, and fourth columns 101-1B, 101-2B, 101-3B, and 101-4B which are parallel with the second array direction RD2. The third set of through vias 110C may be disposed in the third divided region 153 of the interposing bridge 100, and all of the third set of through vias 110C may be configured to include the through vias 101 arrayed in first, second, third, and fourth columns 101-1C, 101-2C, 101-3C, and 101-4C which are parallel with a third array direction RD3. The fourth set of through vias 110D may be disposed in the fourth divided region 154 of the interposing bridge 100, and all of the fourth set of through vias 110C may be configured to include the through vias 101 arrayed in first, second, third, and fourth columns 101-1D, 101-2D, 101-3D, and 101-4D which are parallel with a fourth array direction RD4.

The first, second, third, and fourth array directions RD1, RD2, RD3, and RD4 may be different from each other. There may be the certain reference angle A between the first to fourth array directions RD1, RD2, RD3, and RD4. That is, there may be a difference of 90 degrees between the first to fourth array directions RD1, RD2, RD3, and RD4. When the first to fourth sets of through vias 110A, 110B, 110C, and 110D are disposed in respective ones of the first to fourth divided regions 151, 152, 153, and 154, an angle between the first and second array directions RD1 and RD2 may be 90 degrees, an angle between the second and third array directions RD2 and RD3 may be 90 degrees, an angle between the third and fourth array directions RD3 and RD4 may be 90 degrees, and an angle between the fourth and first array directions RD4 and RD1 may be 90 degrees.

A layout of the second set of through vias 110B may be obtained by rotating the first set of through vias 110A by 90 degrees in a counterclockwise direction with respect to the rotation axis R in a plan view, and a layout of the third set of through vias 110C may be obtained by rotating the second set of through vias 110B by 90 degrees in a counterclockwise direction with respect to the rotation axis R in a plan view. Similarly, a layout of the fourth set of through vias 110D may be obtained by rotating the third set of through vias 110C by 90 degrees in a counterclockwise direction with respect to the rotation axis R in a plan view, and a layout of the first set of through vias 110A may be obtained by rotating the fourth set of through vias 110D by 90 degrees in a counterclockwise direction with respect to the rotation axis R in a plan view.

Some of the first set of through vias 110A may be arrayed in the first array direction RD1 to constitute the first column 101-1A in the first divided region 151, and some of the second set of through vias 110B may be arrayed in the second array direction RD2 to constitute the second column 101-2B in the second divided region 152. There may be a difference of 90 degrees between the first array direction RD1 and the second array direction RD2.

Referring again to FIGS. 3 and 5, the redistribution lines 400 of the unit stack module 20B may be disposed to connect the first to fourth sets of through vias 110A, 110B, 110C, and 110D to respective ones of the semiconductor dies 200. The redistribution lines 400 may be disposed to connect the through vias 101 arrayed in one of the first to fourth columns 101-1A~101-4A in the first divided region 151, the through vias 101 arrayed in one of the first to fourth columns 101-1B~101-4B in the second divided region 152, the through vias 101 arrayed in one of the first to fourth columns 101-1C~101-4C in the third divided region 153, and the through vias 101 arrayed in one of the first to fourth columns 101-1D~101-4D in the fourth divided region 154 to respective ones of the first to fourth semiconductor dies 201, 202, 203, and 204.

The redistribution lines 400 may include first to fourth groups of redistribution lines 400-1, 400-2, 400-3, and 400-4. The first to fourth groups of redistribution lines 400-1, 400-2, 400-3, and 400-4 may be disposed to connect the first to fourth semiconductor dies 201, 202, 203, and 204 to the interposing bridge 100.

The first to fourth groups of redistribution lines 400-1, 400-2, 400-3, and 400-4 may be disposed to connect the first to fourth semiconductor dies 201, 202, 203, and 204 to respective ones of the first to fourth sets of through vias 110A, 110B, 110C, and 110D. The first to fourth groups of redistribution lines 400-1, 400-2, 400-3, and 400-4 may be disposed to be connected to the through vias 101 arrayed in one of the first to fourth columns 101-1A~101-4A in the first divided region 151, the through vias 101 arrayed in one of the first to fourth columns 101-1B~101-4B in the second divided region 152, the through vias 101 arrayed in one of the first to fourth columns 101-1C~101-4C in the third divided region 153, and the through vias 101 arrayed in one of the first to fourth columns 101-1D~101-4D in the fourth divided region 154 to respective ones of the first to fourth semiconductor dies 201, 202, 203, and 204, respectively.

As illustrated in FIG. 3, the first group of redistribution lines 400-1 may be disposed to connect the chip pads 210 of the first semiconductor die 201 to respective ones of the through vias 101 arrayed in the first column 101-1A of the first divided region 151 of the interposing bridge 100. The first group of redistribution lines 400-1 may be connected to only the through vias 101 arrayed in the first column 101-1A of the first divided region 151 of the interposing bridge 100, but not connected to the through vias 101 arrayed in the remaining columns (i.e., the second to fourth columns 101-2A, 101-3A, and 101-4A) of the first divided region 151. In addition, the first group of redistribution lines 400-1 are not connected to any of the through vias 101 disposed in the remaining divided regions (i.e., the second, third, and fourth divided regions 152, 153, and 154) of the interposing bridge 100.

The second group of redistribution lines 400-2 may be disposed to connect the chip pads 210 of the second semiconductor die 202 to respective ones of the through vias 101 arrayed in the second column 101-2B of the second divided region 152 of the interposing bridge 100. When the first group of redistribution lines 400-1 are rotated by 90 degrees in a counterclockwise direction with respect to the rotating axis R in a plan view, the rotated first group of redistribution lines 400-1 may overlap with the second group of redistribution lines 400-2. The third group of redistribution lines 400-3 may be disposed to connect the chip pads 210 of the third semiconductor die 203 to respective ones of the through vias 101 arrayed in the third column 101-3C of the third divided region 153 of the interposing bridge 100. The fourth group of redistribution lines 400-4 may be disposed to connect the chip pads 210 of the fourth semiconductor die 204 to respective ones of the through vias 101 arrayed in the fourth column 101-4D of the fourth divided region 154 of the interposing bridge 100.

As such, the first to fourth groups of redistributed lines 400-1, 400-2, 400-3, and 400-4 may provide electrical paths which are independently connected to respective ones of the first to fourth semiconductor dies 201, 202, 203, and 204. It may be possible to independently and exclusively apply different electrical signals to the first to fourth semiconductor dies 201, 202, 203, and 204 because of the presence of the first to fourth groups of redistributed lines 400-1, 400-2, 400-3, and 400-4. The first to fourth semiconductor dies 201, 202, 203, and 204 may independently operate because the first to fourth semiconductor dies 201, 202, 203, and 204 have their own electrical paths. For example, a chip selection signal may be selectively applied to at least one of the first to fourth semiconductor dies 201, 202, 203, and 204 through at least one of the first to fourth groups of redistributed lines 400-1, 400-2, 400-3, and 400-4.

Figure 6:
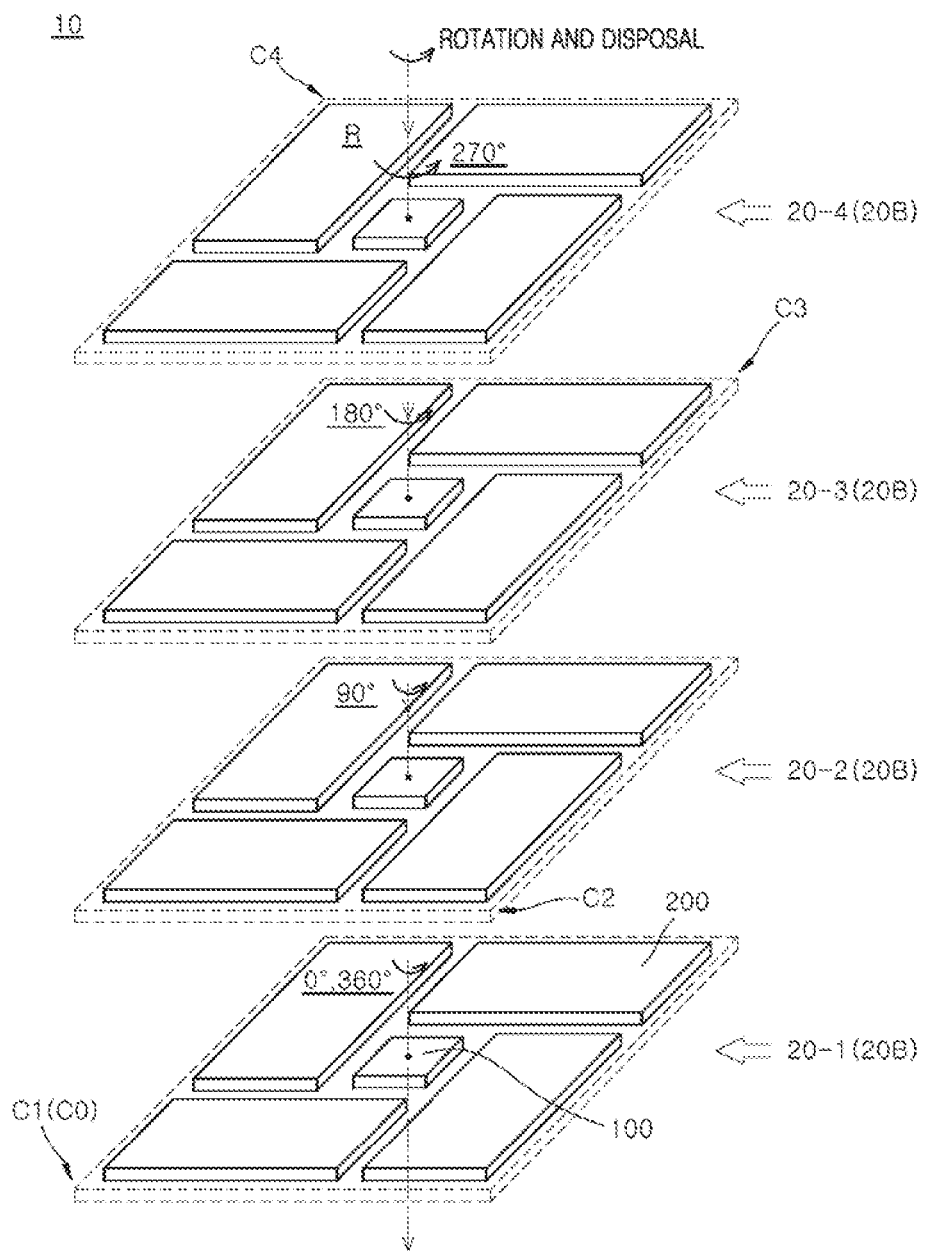
FIG. 6 is an exploded perspective view illustrating unit stack modules stacked in a semiconductor package according to an embodiment.

FIG. 6 is an exploded perspective view illustrating the plurality of unit stack modules 20B stacked in a semiconductor package according to an embodiment.

Referring to FIG. 6, the unit stack modules 20B (i.e., the first to fourth stages of stack modules 20-1, 20-2, 20-3, and 20-4) may be sequentially stacked to constitute the semiconductor package 10. The first stage of stack module 20-1 may be provided as the unit stack module 20B illustrated in FIG. 2, and the second stage of stack module 20-2 may be provided by rotating the unit stack module 20B by 90 degrees in a counterclockwise direction with respect to the rotation axis R and by stacking the rotated unit stack module 20B on the first stage of stack module 20-1. In addition, the third stage of stack module 20-3 may be provided by rotating the unit stack module 20B by 180 degrees in a counterclockwise direction with respect to the rotation axis R and by stacking the rotated unit stack module 20B on the second stage of stack module 20-2, and the fourth stage of stack module 20-4 may be provided by rotating the unit stack module 20B by 270 degrees in a counterclockwise direction with respect to the rotation axis R and by stacking the rotated unit stack module 20B on the third stage of stack module 20-3. The rotation angles of the unit stack module 20B for providing the second, third, and fourth stages of stack modules 20-2, 20-3, and 20-4 may be set to be multiples of a certain reference angle. As illustrated in FIGS. 3 and 5, the reference angle A may be determined by the number of the semiconductor dies 200 disposed in each of the unit stack modules 20B. For example, the reference angle A may be set as an angle which is obtained by dividing 360 degrees by the number of the semiconductor dies 200 belonging to each unit stack module 20B. If the first to fourth semiconductor dies 200 are disposed at a periphery region of the interposing bridge 100, then the reference angle A may be set to be 90 degrees.

When the semiconductor package 10 is configured to include the first to fourth stages of stack modules 20-1, 20-2, 20-3, and 20-4, the first stage of stack modules 20-1 may be provided by rotating the unit stack module 20B by zero degrees or 360 degrees with respect to the rotation axis R, the second stage of stack modules 20-2 may be provided by rotating the unit stack module 20B by 90 degrees with respect to the rotation axis R, the third stage of stack modules 20-3 may be provided by rotating the unit stack module 20B by 180 degrees with respect to the rotation axis R, and the fourth stage of stack modules 20-4 may be provided by rotating the unit stack module 20B by 270 degrees with respect to the rotation axis R.

Each of the first to fourth stages of stack modules 20-1, 20-2, 20-3, and 20-4 may have the same configuration as the unit stack module 20B. The first stage of stack module 20-1 may be provided by the unit stack module 20B, and the second to fourth stages of stack modules 20-2, 20-3, and 20-4 may be provided by rotating the unit stack module 20B by different angles (corresponding to multiples of 90 degrees) with respect to the rotation axis R of the unit stack module 20B and by vertically and sequentially stacking on the first stage of stack module 20-1. In such a case, the 90 degrees may correspond to the reference angle A for determining the rotation angles of the unit stack module 20B to provide the second to fourth stages of stack modules 20-2, 20-3, and 20-4.

Because the second to fourth stages of stack modules 20-2, 20-3, and 20-4 are provided by rotating the unit stack module 20B by different angles corresponding to multiples of 90 degrees with respect to the rotation axis R of the unit stack module 20B and by vertically and sequentially stacking on the first stage of stack module 20-1, corners C2, C3, and C4 of the second to fourth stages of stack modules 20-2, 20-3, and 20-4 corresponding to a corner C1 of the first stage of stack module 20-1 may also be located at positions where the corner C1 is rotated by different angles corresponding to multiples of 90 degrees with respect to the rotation axis R of the unit stack module 20B when viewed from a plan view. The corners C1, C2, C3, and C4 of the first to fourth stages of stack modules 20-1, 20-2, 20-3, and 20-4 may correspond to a corner C0 of the unit stack module 20B.

The number of the unit stack modules 20B which are vertically stacked to provide multiple stages of stack modules may be equal to the number of the semiconductor dies 200 included in each of the unit stack modules 20B. For example, when the four semiconductor dies 200 such as the first to fourth semiconductor dies 201, 202, 203, and 204 are disposed in the unit stack module 20B, the four stages of stack modules such as the first to fourth stages of stack modules 20-1, 20-2, 20-3, and 20-4 may be sequentially stacked.

Figure 7:
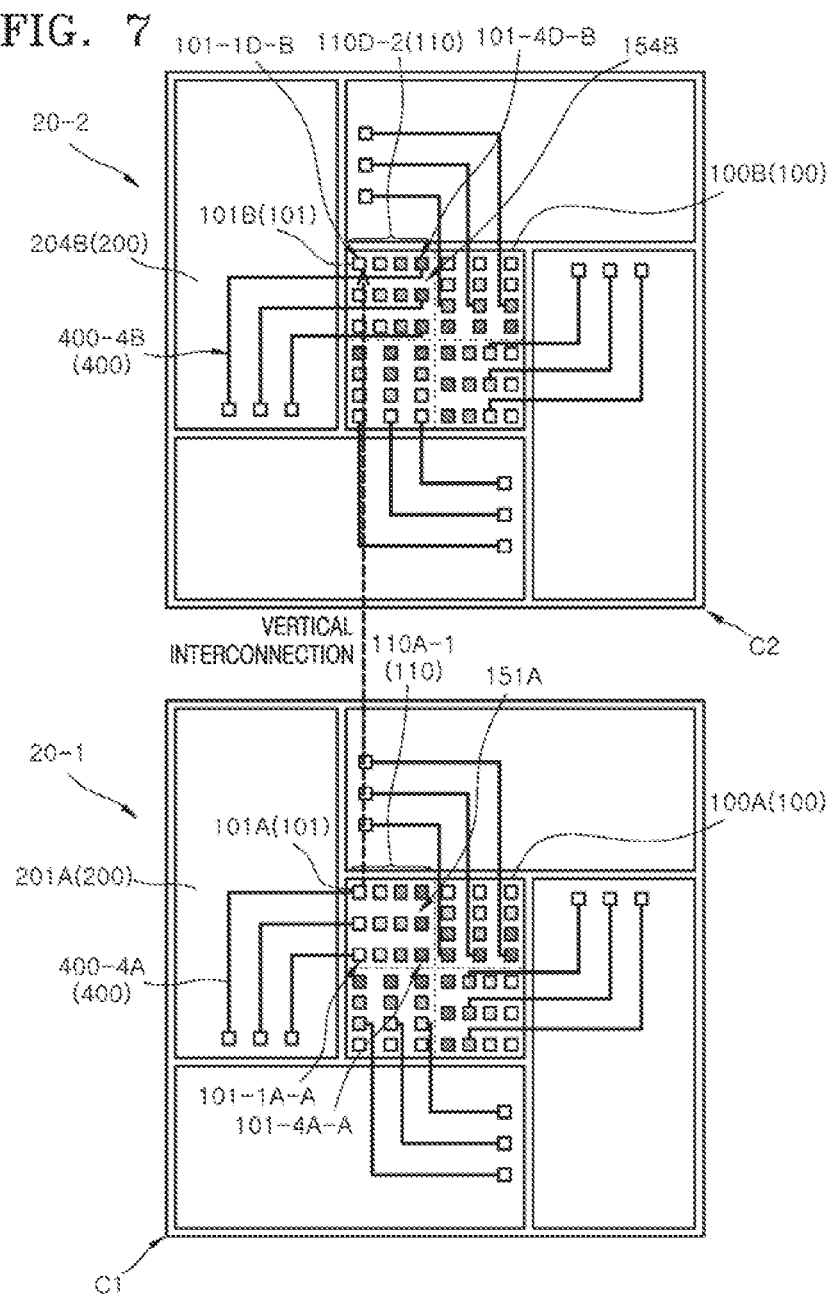
FIG. 7 is a plan view illustrating through vias and redistribution lines of a first stage of a stack module and a second stage of a stack module included in the semiconductor package illustrated in FIG. 6.

FIG. 7 is a plan view illustrating the through vias 101 (i.e., a first stage of through vias 101A and a second stage of through vias 101B) and the redistribution lines 400 (i.e., a first group of redistribution lines 400-1A of the first stage of stack module 20-1 and a fourth group of redistribution lines 400-4B of the second stage of stack module 20-2) disposed in the first and second stages of stack modules 20-1 and 20-2 included in the semiconductor package illustrated in FIG. 6. FIG. 7 schematically illustrates an electrical connection relationship between the first and second stages of stack modules 20-1 and 20-2.

Referring to FIGS. 6 and 7, the second stage of stack module 20-2 stacked on the first stage of stack module 20-1 may have a planar shape which is the same as a layout that is obtained by rotating the first stage of stack module 20-1 by 90 degrees in a counterclockwise direction with respect to the rotation axis R. If the second stage of stack module 20-2 is rotated by 90 degrees in a clockwise direction with respect to the rotation axis R, then the corner C2 of the second stage of stack module 20-2 may overlap with the corner C1 of the first stage of stack module 20-1.

The second stage of stack module 20-2 may be stacked on the first stage of stack module 20-1 such that a second stage of interposing bridge 100B included in the second stage of stack module 20-2 overlaps with a first stage of interposing bridge 100A included in the first stage of stack module 20-1 in a plan view. The second stage of through vias 101B included in the second stage of stack module 20-2 may vertically overlap with the first stage of through vias 101A included in the first stage of stack module 20-1 so that the second stage of through vias 101B may be electrically connected to respective ones of the first stage of through vias 101A. Because the second stage of through vias 101B are electrically connected to the first stage of through vias 101A, the second stage of stack module 20-2 may be electrically connected to the first stage of stack module 20-1. As such, the first and second stages of stack modules 20-1 and 20-2 may be electrically connected to each other through the first stage of through vias 101A and the second stage of through vias 101B vertically overlapping with the first stage of through vias 101A.

Because the first and second stages of stack modules 20-1 and 20-2 are electrically connected to each other through the first stage of through vias 101A and the second stage of through vias 101B, a stack structure of the first stage of interposing bridge 100A and the second stage of interposing bridge 100B may provide an electrical vertical interconnection structure for electrically connecting the first and second stages of stack modules 20-1 and 20-2 to each other.

As the second stage of stack module 20-2 having a shape that the first stage of stack module 20-1 is rotated by 90 degrees in a counterclockwise direction in a plan view is stacked on the first stage of stack module 20-1, a fourth divided region 154B of the second stage of interposing bridge 100B may vertically overlap with a first divided region 151A of the first stage of interposing bridge 100A. A first set of through vias 110A-1 disposed on the first divided region 151A of the first stage of interposing bridge 100A may vertically overlap with a fourth set of through vias 110D-2 disposed on the fourth divided region 154B of the second stage of interposing bridge 100B so that the first set of through vias 110A-1 are electrically connected to the fourth set of through vias 110D-2. The through vias 101 arrayed in a first column 101-1A-A of the first divided region 151A included in the first stage of interposing bridge 100A may be electrically connected to the through vias 101 arrayed in a first column 101-1D-B of the fourth divided region 154B included in the second stage of interposing bridge 100B.

The through vias 101 arrayed in the first column 101-1A-A may be electrically connected to a first semiconductor die 201A of the first stage of stack module 20-1 through the first group of redistribution lines 400-1A. The through vias 101 arrayed in the first column 101-1D-B are not connected to the fourth group of redistribution lines 400-4B of the second stage of stack module 20-2. Thus, the through vias 101 arrayed in the first column 101-1D-B may be disconnected from a fourth semiconductor die 204B of the second stage of stack module 20-2. In other words, the first group of redistribution lines 400-1A may be connected to only the through vias 101 arrayed in the first column 101-1A-A, and the fourth group of redistribution lines 400-4B may be connected to only the through vias 101 arrayed in a fourth column 101-4D-B (not vertically overlapping with the first column 101-1A-A) of the fourth divided region 154B included in the second stage of interposing bridge 100B.

The through vias 101 arrayed in the first column 101-1A-A, the through vias 101 arrayed in the first column 101-1D-B, and the first group of redistribution lines 400-1A may provide electrical paths which are electrically connected to the first semiconductor die 201A of the first stage of stack module 20-1 and which are electrically isolated from the fourth semiconductor die 204B of the second stage of stack module 20-2.

The through vias 101 arrayed in the fourth column 101-4D-B of the fourth divided region 154B included in the second stage of interposing bridge 100B may be vertically connected to the through vias 101 arrayed in a fourth column 101-4A-A of the first divided region 151A included in the first stage of interposing bridge 100A. The through vias 101 arrayed in the fourth column 101-4D-B may be electrically connected to the fourth semiconductor die 204B of the second stage of stack module 20-2 through the fourth group of redistribution lines 400-4B of the second stage of stack module 20-2. Because the through vias 101 arrayed in the fourth column 101-4A-A are not connected to the first group of redistribution lines 400-1A of the first stage of stack module 20-1, the through vias 101 arrayed in the fourth column 101-4A-A may be disconnected from the first semiconductor die 201A of the first stage of stack module 20-1. Accordingly, the through vias 101 arrayed in the fourth column 101-4D-B, the through vias 101 arrayed in the fourth column 101-4A-A, and the fourth group of redistribution lines 400-4B may provide electrical paths which are electrically connected to the fourth semiconductor die 204B of the second stage of stack module 20-2 and which are electrically isolated from the first semiconductor die 201A of the first stage of stack module 20-1.

As described above, the through vias 101 arrayed in the fourth column 101-4D-B, the through vias 101 arrayed in the fourth column 101-4A-A, and the fourth group of redistribution lines 400-4B may provide electrical paths which are electrically connected to only the fourth semiconductor die 204B of the second stage of stack module 20-2. In addition, the through vias 101 arrayed in the first column 101-1A-A, the through vias 101 arrayed in the first column 101-1D-B, and the first group of redistribution lines 400-1A may provide electrical paths which are electrically connected to only the first semiconductor die 201A of the first stage of stack module 20-1.

Two different groups of signals may be independently and selectively applied to the first semiconductor die 201A of the first stage of stack module 20-1 and the fourth semiconductor die 204B of the second stage of stack module 20-2 through the electrical paths including two independent groups of electrical paths described above, respectively. Thus, the first semiconductor die 201A and the fourth semiconductor die 204B may independently operate using the two independent groups of electrical paths.

FIG. 8 is a plan view illustrating the second stage of through vias 101B and the fourth group of redistribution lines 400-4B included in the second stage of stack module 20-2 illustrated in FIG. 6 as well as a third stage of through vias 101C and a third group of redistribution lines 400-3C included in the third stage of stack module 20-3 illustrated in FIG. 6.

Referring to FIGS. 6 and 8, the third stage of stack module 20-3 stacked on the second stage of stack module 20-2 may have a planar shape which is the same as a layout that is obtained by rotating the first stage of stack module 20-1 by 180 degrees in a counterclockwise direction with respect to the rotation axis R. If the third stage of stack module 20-3 is rotated by 180 degrees in a clockwise direction with respect to the rotation axis R, then the corner C3 of the third stage of stack module 20-3 may overlap with the corner C1 of the first stage of stack module 20-1 illustrated in FIG. 7. If the third stage of stack module 20-3 is rotated by 90 degrees in a clockwise direction with respect to the rotation axis R, then the corner C3 of the third stage of stack module 20-3 may overlap with the corner C2 of the second stage of stack module 20-2.

The third stage of stack module 20-3 may be stacked on the second stage of stack module 20-2 such that a third stage of interposing bridge 100C included in the third stage of stack module 20-3 overlaps with the second stage of interposing bridge 100B included in the second stage of stack module 20-2 in a plan view. The third stage of through vias 101C included in the third stage of stack module 20-3 may vertically overlap with the second stage of through vias 101B included in the second stage of stack module 20-2 so that the third stage of through vias 101C may be electrically connected to respective ones of the second stage of through vias 101B. Because the third stage of through vias 101C are electrically connected to the second stage of through vias 101B, the third stage of stack module 20-3 may be electrically connected to the second stage of stack module 20-2.

As the third stage of stack module 20-3 having a shape that the second stage of stack module 20-2 is rotated by 90 degrees in a counterclockwise direction in a plan view is stacked on the second stage of stack module 20-2, a third divided region 153C of the third stage of interposing bridge 100C may vertically overlap with the fourth divided region 154B of the second stage of interposing bridge 100B. The fourth set of through vias 110D-2 disposed on the fourth divided region 154B of the second stage of interposing bridge 100B may vertically overlap with a third set of through vias 110C-3 disposed on the third divided region 153C of the third stage of interposing bridge 100C so that the fourth set of through vias 110D-2 are electrically connected to the third set of through vias 110C-3. The through vias 101 arrayed in a third column 101-3C-C of the third divided region 153C included in the third stage of interposing bridge 100C may be electrically connected to the through vias 101 arrayed in a third column 101-3D-B of the fourth divided region 154B included in the second stage of interposing bridge 100B.

The through vias 101 arrayed in the third column 101-3C-C may be electrically connected to a third semiconductor die 203C of the third stage of stack module 20-3 through the third group of redistribution lines 400-3C. The through vias 101 arrayed in the third column 101-3D-B are not connected to any of the semiconductor dies 200 included in the second stage of stack module 20-2. The third group of redistribution lines 400-3C, the through vias 101 arrayed in the third column 101-3C-C, and the through vias 101 arrayed in the third column 101-3D-B may provide exclusive electrical paths which are electrically connected to only the third semiconductor die 203C of the third stage of stack module 20-3. A group of signals may be independently and selectively applied only to the third semiconductor die 203C of the third stage of stack module 20-3 through the exclusive electrical paths including the third group of redistribution lines 400-3C, the through vias 101 arrayed in the third column 101-3C-C, and the through vias 101 arrayed in the third column 101-3D-B. Thus, the third semiconductor die 203C of the third stage of stack module 20-3 may independently operate using the exclusive electrical paths including the third group of redistribution lines 400-3C, the through vias 101 arrayed in the third column 101-3C-C, and the through vias 101 arrayed in the third column 101-3D-B.

FIG. 9 is a plan view illustrating the third stage of through vias 101C and the third group of redistribution lines 400-3C included in the third stage of stack module 20-3 illustrated in FIG. 6 as well as a fourth stage of through vias 101D and a second group of redistribution lines 400-2D included in the fourth stage of stack module 20-4 illustrated in FIG. 6.

Referring to FIGS. 6 and 9, the fourth stage of stack module 20-4 stacked on the third stage of stack module 20-3 may have a planar shape which is the same as a layout that is obtained by rotating the first stage of stack module 20-1 by 270 degrees in a counterclockwise direction with respect to the rotation axis R. If the fourth stage of stack module 20-4 is rotated by 270 degrees in a clockwise direction with respect to the rotation axis R, then the corner C4 of the fourth stage of stack module 20-4 may overlap with the corner C1 of the first stage of stack module 20-1 illustrated in FIG. 7. If the fourth stage of stack module 20-4 is rotated by 90 degrees in a clockwise direction with respect to the rotation axis R, then the corner C4 of the fourth stage of stack module 20-4 may overlap with the corner C3 of the third stage of stack module 20-3.

The fourth stage of stack module 20-4 may be stacked on the third stage of stack module 20-3 such that a fourth stage of interposing bridge 100D included in the fourth stage of stack module 20-4 overlaps with the third stage of interposing bridge 100C included in the third stage of stack module 20-3 in a plan view. The fourth stage of through vias 101D included in the fourth stage of stack module 20-4 may vertically overlap with the third stage of through vias 101C included in the third stage of stack module 20-3 so that the fourth stage of through vias 101D may be electrically connected to respective ones of the third stage of through vias 101C. Because the fourth stage of through vias 101D are electrically connected to the third stage of through vias 101C, the fourth stage of stack module 20-4 may be electrically connected to the third stage of stack module 20-3.

As the fourth stage of stack module 20-4 having a shape that the third stage of stack module 20-3 is rotated by 90 degrees in a counterclockwise direction in a plan view is stacked on the third stage of stack module 20-3, a second divided region 152D of the fourth stage of interposing bridge 100D may vertically overlap with the third divided region 153C of the third stage of interposing bridge 100C. The third set of through vias 110C-3 disposed on the third divided region 153C of the third stage of interposing bridge 100C may be vertically overlap with a second set of through vias 110B-4 disposed on the second divided region 152D of the fourth stage of interposing bridge 100D so that the third set of through vias 110C-3 are electrically connected to the second set of through vias 110B-4. The through vias 101 arrayed in a second column 101-2B-D of the second divided region 152D included in the fourth stage of interposing bridge 100D may be electrically connected to the through vias 101 arrayed in a second column 101-2C-C of the third divided region 153C included in the third stage of interposing bridge 100C.

The through vias 101 arrayed in the second column 101-2B-D may be electrically connected to a second semiconductor die 202D of the fourth stage of stack module 20-4 through the second group of redistribution lines 400-2D. The through vias 101 arrayed in the second column 101-2C-C are not connected to any of the semiconductor dies 200 included in the third stage of stack module 20-3. Thus, the second group of redistribution lines 400-2D, the through vias 101 arrayed in the second column 101-2B-D, and the through vias 101 arrayed in the second column 101-2C-C may provide exclusive electrical paths which are electrically connected to only the second semiconductor die 202D of the fourth stage of stack module 20-4. A group of signals may be independently and selectively applied only to the second semiconductor die 202D of the fourth stage of stack module 20-4 through the exclusive electrical paths including the second group of redistribution lines 400-2D, the through vias 101 arrayed in the second column 101-2B-D, and the through vias 101 arrayed in the second column 101-2C-C. Thus, the second semiconductor die 202D of the fourth stage of stack module 20-4 may independently operate using the exclusive electrical paths including the second group of redistribution lines 400-2D, the through vias 101 arrayed in the second column 101-2B-D, and the through vias 101 arrayed in the second column 101-2C-C.

Figure 10:
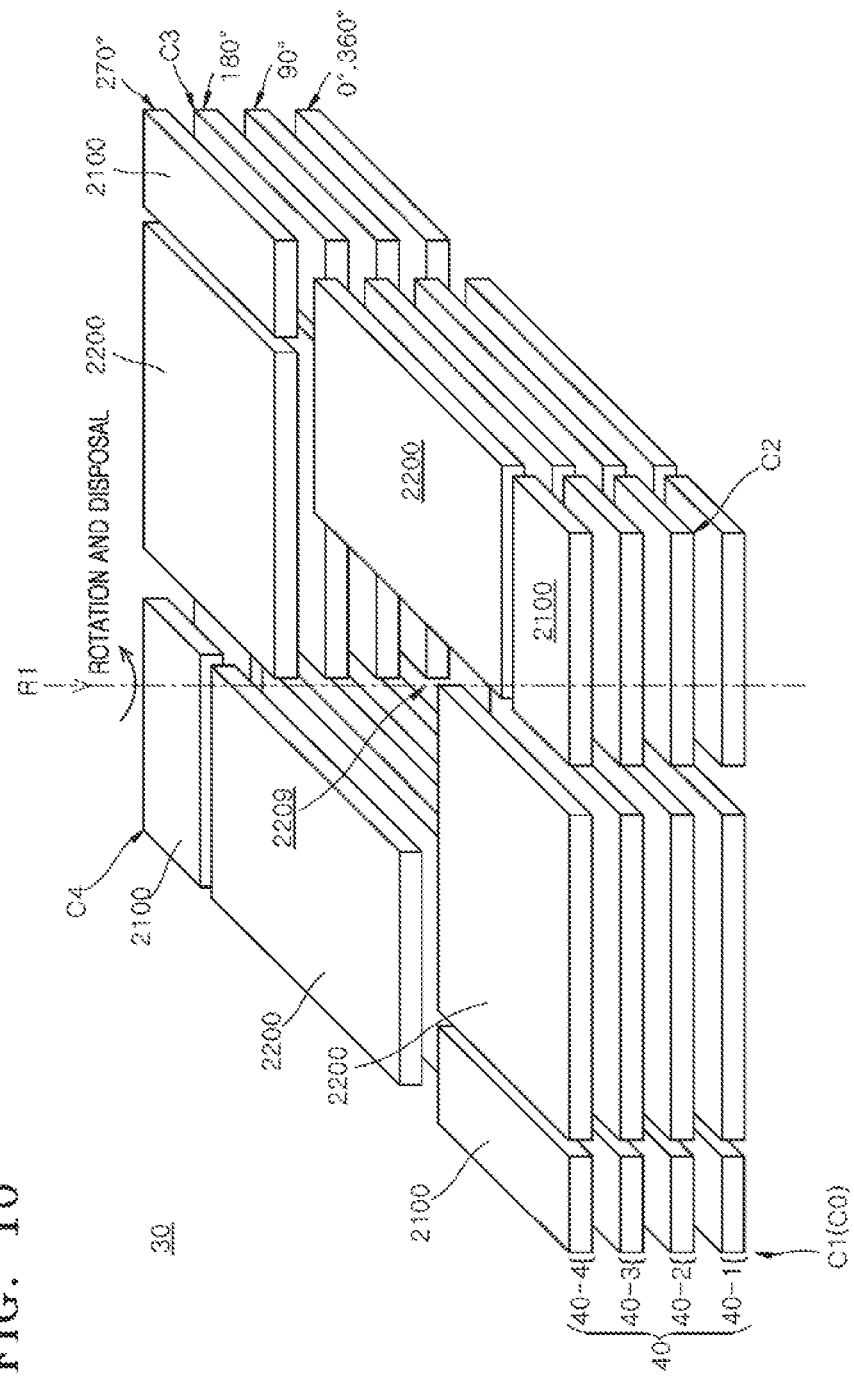
FIG. 10 is a perspective view illustrating a semiconductor package according to another embodiment.

FIG. 10 is a perspective view illustrating a semiconductor package 30 according to another embodiment.

Referring to FIG. 10, the semiconductor package 30 may be configured to include a plurality of stack modules 40 which are vertically stacked. The plurality of stack modules 40 may include first to fourth stages of stack modules 40-1, 40-2, 40-3, and 40-4 which are sequentially stacked. Each of the first to fourth stages of stack modules 40-1, 40-2, 40-3, and 40-4 may have the same configuration to act as a unit stack module. The unit stack module may be used as a basic stack unit of the plurality of stack modules 40.

Figure 11:
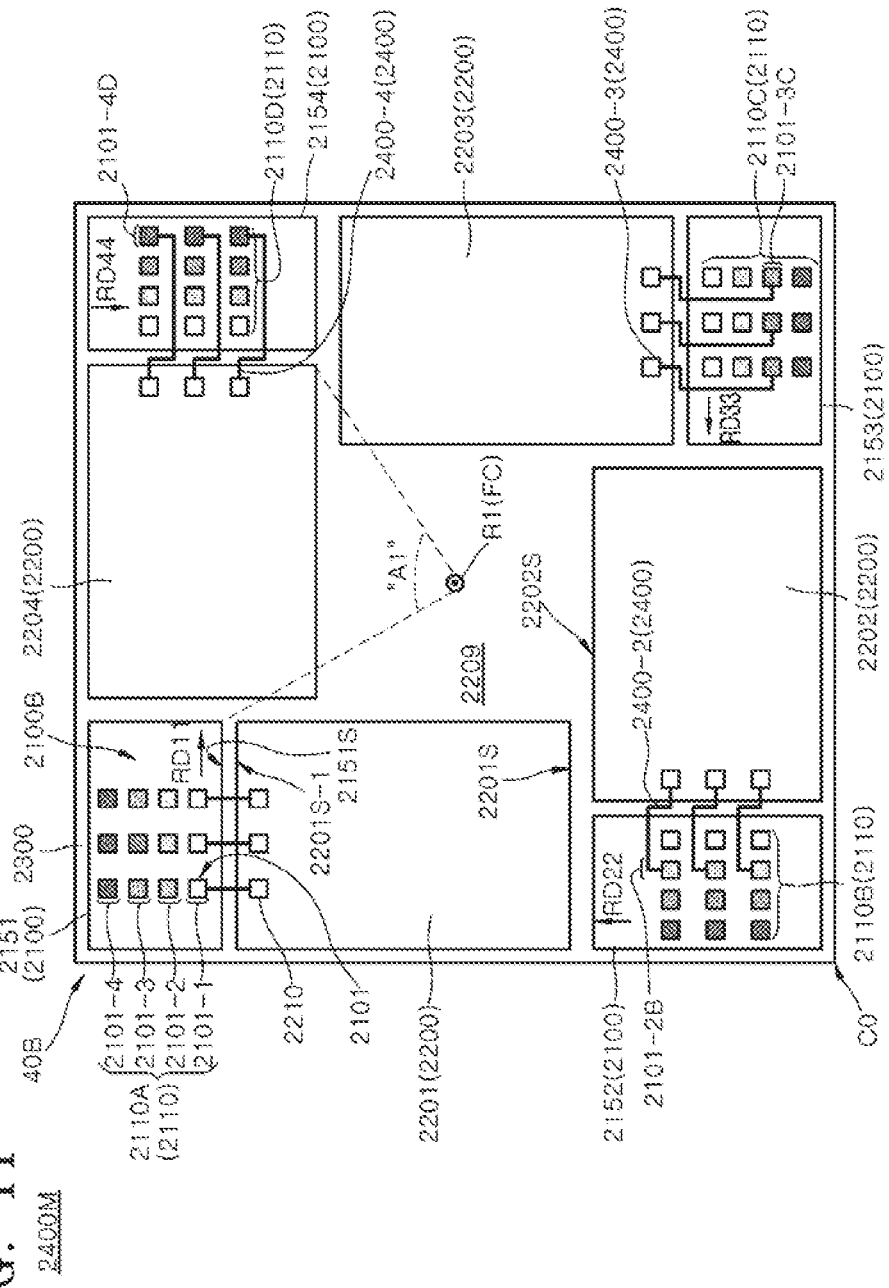
FIG. 11 is a plan view illustrating through vias and redistribution lines of a stack module included in a semiconductor package according to another embodiment.

FIG. 11 is a plan view illustrating a planar layout 2400M of through vias 2101 and redistribution lines 2400 included in a unit stack module 40B corresponding to each of the first to fourth stages of stack modules 40-1, 40-2, 40-3, and 40-4 constituting the semiconductor package 30 illustrated in FIG. 10.

FIGS. 10 and 11, the unit stack module 40B may be configured to include a plurality of interposing bridges 2100 and a plurality of semiconductor dies 2200. The plurality of interposing bridges 2100 may be assigned to the plurality of semiconductor dies 2200, respectively. Accordingly, the number of the interposing bridges 2100 may be equal to the number of the semiconductor dies 2200. An encapsulant 2300 may bind and integrate the plurality of interposing bridges 2100 and the plurality of semiconductor dies 2200 in one modularized member. In FIG. 10, each of the first to fourth stages of stack modules 40-1, 40-2, 40-3, and 40-4 is illustrated without the encapsulant 2300 for the purpose of ease and convenience in explanation.

In the unit stack module 40B, the plurality of semiconductor dies 2200 may be disposed in a pinwheel form. That is, the plurality of semiconductor dies 2200 (e.g., first to fourth semiconductor dies 2201, 2202, 2203, and 2204) may be disposed to have a rim-shaped form surrounding an empty space 2209 such that side surfaces of the plurality of semiconductor dies 2200 face each other. The first semiconductor die 2201 may be disposed to be adjacent to the second semiconductor die 2202 such that a portion of a side surface 2201S of the first semiconductor die 2201 faces a portion of a side surface 2202S of the second semiconductor die 2202. The side surface 2201S of the first semiconductor die 2201 may have a length which is less than a length of the side surface 2202S of the second semiconductor die 2202.

The second semiconductor die 2202 may be disposed at a location where the first semiconductor die 2201 is rotated by a reference angle A1 in a counterclockwise direction with respect to a rotation axis R1 of the unit stack module 40B. In the present embodiment, the second semiconductor die 2202 may be disposed at a location where the first semiconductor die 2201 is rotated by 90 degrees in a counterclockwise direction with respect to the rotation axis R1, and the third semiconductor die 2203 may be disposed at a location where the second semiconductor die 2202 is rotated by 90 degrees in a counterclockwise direction with respect to the rotation axis R1. Similarly, the fourth semiconductor die 2204 may be disposed at a location where the third semiconductor die 2203 is rotated by 90 degrees in a counterclockwise direction with respect to the rotation axis R1, and the first semiconductor die 2201 may be disposed at a location where the fourth semiconductor die 2204 is rotated by 90 degrees in a counterclockwise direction with respect to the rotation axis R1. That is, if the first to fourth semiconductor dies 2201, 2202, 2203, and 2204 are rotated by 90 degrees with respect to the rotation axis R1 in a counterclockwise direction in a plan view, then the first, second, third, and fourth semiconductor dies 2201, 2202, 2203, and 2204 may move to places where the second, third, fourth, and first semiconductor dies 2202, 2203, 2204, and 2201 are originally located, respectively. The rotation axis R1 may be an axis that vertically passes through a faced center FC of a planar surface of the unit stack module 40B.

The interposing bridges 2100 may be disposed to be adjacent to the semiconductor dies 2200, respectively. The interposing bridges 2100 may include first to fourth interposing bridges 2151, 2152, 2153, and 2154. The first to fourth interposing bridges 2151, 2152, 2153, and 2154 may be disposed such that side surfaces of the first to fourth interposing bridges 2151, 2152, 2153, and 2154 face side surfaces of the first to fourth semiconductor dies 2201, 2202, 2203, and 2204 respectively. For example, the first interposing bridge 2151 may be disposed to be adjacent to the first semiconductor die 2201 and the fourth semiconductor die 2204 such that a side surface 2151S of the first interposing bridge 2151 faces to a side surface 2201S-1 of the first semiconductor die 2201 opposite to the second interposing bridge 2152. If the first to fourth interposing bridges 2151, 2152, 2153, and 2154 are rotated by the reference angle A1 (i.e., 90 degrees) with respect to the rotation axis R1 in a counterclockwise direction in a plan view, then the first, second, third, and fourth interposing bridges 2151, 2152, 2153, and 2154 may move to places where the second, third, fourth, and first interposing bridges 2152, 2153, 2154, and 2151 are originally located, respectively.

The first to fourth interposing bridges 2151, 2152, 2153, and 2154 may have substantially the same configuration and the same shape. Each of the first to fourth interposing bridges 2151, 2152, 2153, and 2154 may be configured to include an interposing bridge body 2100B and the through vias 2101 vertically penetrating the interposing bridge body 2100B.

The first to fourth interposing bridges 2151, 2152, 2153, and 2154 may be interconnection members corresponding to respective ones of the first to fourth divided regions 151, 152, 152, and 154 of the interposing bridge 100 illustrated in FIGS. 3 and 5. The interposing bridges 2100 may correspond to the divided regions 150 which are separated from the interposing bridge 100 described with reference to FIG. 3. That is, the first to fourth interposing bridges 2151, 2152, 2153, and 2154 may correspond to the first to fourth divided regions 151, 152, 153, and 154 of the interposing bridge 100, which are separated from each other.

Each of the first to fourth interposing bridges 2151, 2152, 2153, and 2154 may be configured to include the through vias 2101 arrayed in first to fourth columns 2101-1, 2101-2, 2101-3, and 2101-4. The through vias 2101 arrayed in the first to fourth columns 2101-1, 2101-2, 2101-3, and 2101-4 of the first interposing bridge 2151 may constitute a first set of through vias 2110A. A second set through vias 2110B, a third set of through vias 2110C, and a fourth set of through vias 2110D may be disposed in the second, third, and fourth interposing bridge 2152, 2153, and 2154, respectively. Each of the second to fourth sets of through vias 2110B, 2110C, and 2110D may have the same configuration as the first set of through vias 2110A. The first to fourth sets of through vias 2110A, 2110B, 2110C, and 2110D may be four sets of through vias 2110.

The first, second, third, and fourth columns 2101-1, 2101-2, 2101-3, and 2101-4 in which the first set of through vias 2110A are arrayed may be parallel with a first array direction RD11. First to fourth columns in which the second set of through vias 2110B are arrayed may be parallel with a second array direction RD22. First to fourth columns in which the third set of through vias 2110C are arrayed may be parallel with a third array direction RD33. First to fourth columns in which the fourth set of through vias 2110D are arrayed may be parallel with a fourth array direction RD44. The first to fourth interposing bridges 2151, 2152, 2153, and 2154 may be located at positions where the fourth, first, second, and third interposing bridges 2154, 2151, 2152, and 2143 are rotated by 90 degrees in a counterclockwise direction with respect to the rotation axis R1, respectively. Thus, there may be a difference of 90 degrees between the first to fourth array directions RD11, RD22, RD33, and RD44.

The unit stack module 40B may be configured to include the redistribution lines 2400. The redistribution lines 2400 may be disposed to connect the interposing bridges 2100 to respective ones of the semiconductor dies 2200. The redistribution lines 2400 may be disposed to connect the first to fourth interposing bridges 2151, 2152, 2153, and 2154 to respective ones of the first to fourth semiconductor dies 2201, 2202, 2203, and 2204. The redistribution lines 2400 may be disposed to connect the first semiconductor die 2101 to the through vias arrayed in the first column 2101-1 of the first interposing bridge 2151. The redistribution lines 2400 may be disposed to connect the second semiconductor die 2102 to the through vias arrayed in a second column 2101-2B of the second interposing bridge 2152. The redistribution lines 2400 may be disposed to connect the third semiconductor die 2103 to the through vias arrayed in a third column 2101-3C of the third interposing bridge 2153. The redistribution lines 2400 may be disposed to connect the fourth semiconductor die 2104 to the through vias arrayed in a fourth column 2101-4D of the fourth interposing bridge 2154.

A first group of distribution lines 2400-1 of the redistribution lines 2400 may be disposed to connect the through vias 2101 arrayed in the first column 2101-1 of the first interposing bridge 2151 to chip pads 2210 of the first semiconductor die 2101. The first group of distribution lines 2400-1 may be disconnected from the through vias 2101 arrayed in the second to fourth columns 2101-2, 2101-3, and 2101-4.

A second group of distribution lines 2400-2 of the redistribution lines 2400 may be disposed to connect the through vias 2101 arrayed in the second column 2101-2B of the second interposing bridge 2152 to chip pads of the second semiconductor die 2102. A third group of distribution lines 2400-3 of the redistribution lines 2400 may be disposed to connect the through vias 2101 arrayed in the third column 2101-3C of the third interposing bridge 2153 to chip pads of the third semiconductor die 2103. A fourth group of distribution lines 2400-4 of the redistribution lines 2400 may be disposed to connect the through vias 2101 arrayed in the fourth column 2101-4D of the fourth interposing bridge 2154 to chip pads of the fourth semiconductor die 2104.

The first to fourth groups of distribution lines 2400-1, 2400-2, 2400-3, and 2400-4 are connected to respective ones of the first to fourth semiconductor dies 2201, 2202, 2203, and 2204 which are different from each other. Thus, the first to fourth groups of distribution lines 2400-1, 2400-2, 2400-3, and 2400-4 may provide independent electrical paths which are connected to respective ones of the semiconductor dies 2201, 2202, 2203, and 2204 included in the unit stack module 40B. Accordingly, the first to fourth semiconductor dies 2201, 2202, 2203, and 2204 included in the unit stack module 40B may independently operate using the first to fourth groups of distribution lines 2400-1, 2400-2, 2400-3, and 2400-4.

Referring again to FIGS. 10 and 11, each of the first to fourth stages of stack modules 40-1, 40-2, 40-3, and 40-4 included in the semiconductor package 30 may be configured to have the same form as the unit stack module 40B. The first stage of stack module 40-1 may be provided by the unit stack module 40B, and the second to fourth stages of stack modules 40-2, 40-3, and 40-4 may be provided by rotating the unit stack module 40B by different angles (corresponding to multiples of 90 degrees) with respect to the rotation axis R1 of the unit stack module 40B and by vertically and sequentially stacking on the first stage of stack module 40-1.

When the first to fourth stages of stack modules 40-1, 40-2, 40-3, and 40-4 constitute the semiconductor package 30, the first stage of stack module 40-1 may be provided by rotating the unit stack module 40B by zero degrees or 360 degrees with respect to the rotation axis R1. A corner C1 of the first stage of stack module 40-1 may be located at the same position as a corner C0 of the unit stack module 40B. The second stage of stack module 40-2 may be provided by rotating the unit stack module 40B by 90 degrees in a counterclockwise direction with respect to the rotation axis R1 and by stacking the rotated unit stack module 40B on the first stage of stack module 40-1. In addition, the third stage of stack module 40-3 may be provided by rotating the unit stack module 40B by 180 degrees in a counterclockwise direction with respect to the rotation axis R1 and by stacking the rotated unit stack module 40B on the second stage of stack module 40-2, and the fourth stage of stack module 40-4 may be provided by rotating the unit stack module 40B by 270 degrees in a counterclockwise direction with respect to the rotation axis R1 and by stacking the rotated unit stack module 40B on the third stage of stack module 40-3.

Because the second to fourth stages of stack modules 40-2, 40-3, and 40-4 are provided by rotating the unit stack module 40B by different angles corresponding to multiples of 90 degrees with respect to the rotation axis R1 of the unit stack module 40B and by vertically and sequentially stacking on the first stage of stack module 40-1, corners C2, C3, and C4 of the second to fourth stages of stack modules 40-2, 40-3, and 40-4 corresponding to a corner C1 of the first stage of stack module 40-1 may also be located at positions where the corner C1 is rotated by different angles corresponding to multiples of 90 degrees with respect to the rotation axis R1 of the unit stack module 40B when viewed from a plan view. The corners C1, C2, C3, and C4 of the first to fourth stages of stack modules 40-1, 40-2, 40-3, and 40-4 may correspond to a corner C0 of the unit stack module 40B.

The number of the unit stack modules 40B which are vertically stacked to provide multiple stages of stack modules may be equal to the number of the semiconductor dies 2200 included in each of the unit stack modules 40B. For example, when the four semiconductor dies 2200 such as the first to fourth semiconductor dies 2201, 2202, 2203, and 2204 are disposed in the unit stack module 40B, the four stages of stack modules such as the first to fourth stages of stack modules 40-1, 40-2, 40-3, and 40-4 may be sequentially stacked and the four interposing bridges 2100 may also be disposed.

According to the embodiments of the present disclosure, a semiconductor package may be provided by vertically stacking a plurality of stack modules, each of which is configured to include at least one interposing bridge and a plurality of semiconductor dies. In such a case, the stack modules are provided by rotating a unit stack module by different angles with respect to a rotation axis of the unit stack module, and the rotated unit stack modules may be sequentially and vertically stacked to provide the semiconductor package.

Figure 12:
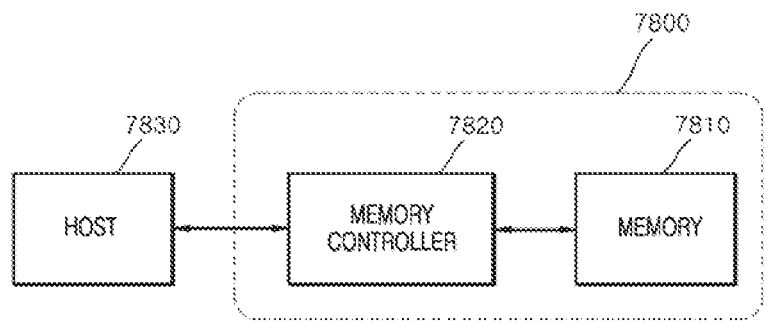
FIG. 12 is a block diagram illustrating an electronic system employing a memory card including at least one semiconductor package according to an embodiment.

FIG. 12 is a block diagram illustrating an electronic system including a memory card 7800 employing at least one of the semiconductor packages according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 13:
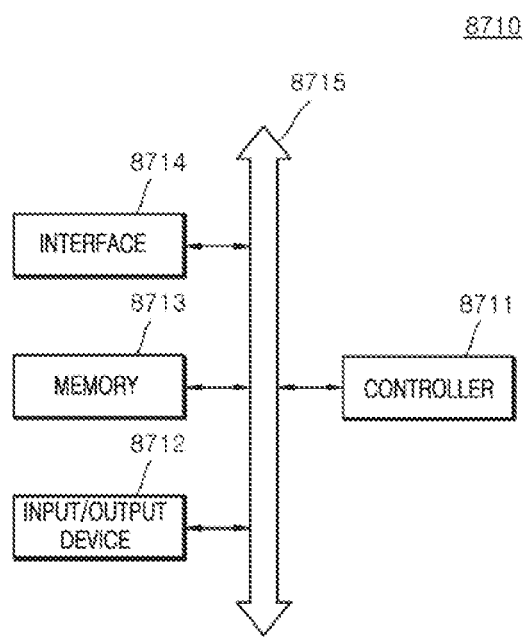
FIG. 13 is a block diagram illustrating another electronic system including at least one of semiconductor package according to an embodiment.

FIG. 13 is a block diagram illustrating an electronic system 8710 including at least one of the semiconductor packages according to the embodiments. The electronic system 8710 may include a controller 8711, an input/output unit 8712, and a memory 8713. The controller 8711, the input/output unit 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the semiconductor packages according to the embodiments of the present disclosure. The input/output unit 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, then the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

The present teachings have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but an illustrative standpoint. The scope of the present teachings are not limited to the above descriptions but are defined by the accompanying claims, and all of distinctive features in the equivalent scope should be construed as being included in the present teachings.

What is claimed is:
1. A semiconductor package comprising:
a plurality of stack modules which are vertically stacked by rotating each of the stack modules by different rotation angles corresponding to multiples of a reference angle with respect to a rotation axis of the stack modules and by vertically and sequentially stacking the rotated stack modules,
wherein each of the plurality of stack modules includes:
an interposing bridge;
a plurality of semiconductor dies disposed at a periphery region of the interposing bridge; and redistribution lines connecting the plurality of semiconductor dies to the interposing bridge, wherein the interposing bridge includes:
an interposing bridge body including a plurality of divided regions, each of which is divided by the reference angle using the rotation axis as a reference axis in a plan view; and
a plurality of sets of through vias disposed to penetrate the interposing bridge body and arrayed in a plurality of columns in a plan view, wherein the plurality of sets of through vias are rotated by the different rotation angles and are disposed in respective ones of the plurality of divided regions, wherein the redistribution lines are disposed to connect the plurality of sets of through vias to respective ones of the semiconductor dies, and wherein the columns in which the through vias connected to the redistribution lines are arrayed are different according to the plurality of divided regions.

2. The semiconductor package of claim 1, wherein the through vias included in the plurality of stack modules are vertically stacked to overlap with each other and are vertically connected to each other.

3. The semiconductor package of claim 1, wherein one of the redistribution lines is connected to only one of the through vias that vertically overlap with each other.

4. The semiconductor package of claim 1, wherein the number of the divided regions included in the interposing bridge is equal to the number of the semiconductor dies included in one of the stack modules.

5. The semiconductor package of claim 1, wherein the number of the stack modules, which are vertically stacked, is equal to the number of the semiconductor dies included in one of the stack modules.

6. The semiconductor package of claim 1, wherein the reference angle is equal to 360 degrees divided by the number of the semiconductor dies belonging to each of the stack modules.

7. The semiconductor package of claim 1, wherein the semiconductor dies are disposed to have a rim-shaped form surrounding side surfaces of the interposing bridge.

8. The semiconductor package of claim 1,
wherein a first set of through vias of the plurality of sets of through vias are disposed in a first divided region of the plurality of divided regions;
wherein a second set of through vias of the plurality of sets of through vias are disposed in a second divided region of the plurality of divided regions;
wherein the first set of through vias are arrayed in a first array direction;
wherein the second set of through vias are arrayed in a second array direction; and
wherein an angle between the first and second array directions is equal to the reference angle.

9. The semiconductor package of claim 1, wherein all of the stack modules have the same configuration and the same shape.

10. A semiconductor package comprising:
first to fourth stages of stack modules which are vertically stacked by rotating each of the stack modules by different rotation angles corresponding to multiples of 90 degrees with respect to a rotation axis of the stack modules and by vertically and sequentially stacking the rotated stack modules,
wherein each of the first to fourth stages of stack modules includes:
an interposing bridge;
first to fourth semiconductor dies disposed to surround the interposing bridge such that side surfaces of the first to fourth semiconductor dies face each other; and
first to fourth groups of redistribution lines disposed to connect the first to fourth semiconductor dies to the interposing bridge,
wherein the interposing bridge includes:
an interposing bridge body including first to fourth divided regions, each of which is divided by 90 degrees using the rotation axis as a reference axis in a plan view; and
first to fourth sets of through vias disposed in respective ones of the first to fourth divided regions and arrayed in four different array directions according the divided regions, wherein each of the first to fourth sets of through vias are arrayed in a plurality of columns and an angle between the four different array directions is 90 degrees,
wherein the first to fourth sets of through vias are disposed in the first to fourth divided regions, respectively, and
wherein columns in which the through vias connected to the first to fourth redistribution lines are arrayed are different according to the plurality of divided regions.

11. The semiconductor package of claim 10, wherein the first to fourth semiconductor dies included in each of the first to fourth stages of stack modules move to positions where the second, third, fourth, and first semiconductor dies are originally located if the first to fourth semiconductor dies are rotated by 90 degrees in a counterclockwise direction with respect to the rotation axis.

12. The semiconductor package of claim 10, wherein if the first to fourth sets of through vias included in each of the first to fourth stages of stack modules are rotated by 90 degrees with respect to the rotation axis, then the rotated first to fourth sets of through vias overlap with the first to fourth sets of through vias that are originally located.

13. The semiconductor package of claim 10, wherein the through vias included in the first to fourth stages of stack modules are vertically stacked to overlap with each other and are vertically connected to each other.

14. The semiconductor package of claim 13, wherein one of the redistribution lines is connected to only one of the through vias that vertically overlap with each other.

15. A semiconductor package comprising:
a plurality of stack modules which are vertically stacked by rotating each of the stack modules by different rotation angles corresponding to multiples of a reference angle with respect to a rotation axis of the stack modules and by vertically and sequentially stacking the rotated stack modules,
wherein each of the plurality of stack modules includes:
a plurality of semiconductor dies disposed to have a rim-shaped form;
a plurality of interposing bridges disposed to be adjacent to respective ones of the semiconductor dies; and
redistribution lines connecting the plurality of semiconductor dies to respective ones of the plurality of interposing bridges,
wherein each of the interposing bridges includes:
an interposing bridge body; and
a plurality of through vias disposed to penetrate the interposing bridge body and arrayed in a plurality of columns in a plan view,
wherein if the interposing bridges are rotated by the reference angle with respect to the rotation axis, then the rotated interposing bridges overlap with the interposing bridges which are originally located, wherein the redistribution lines are disposed to connect the interposing bridges to respective ones of the semiconductor dies, and wherein the columns in which the through vias connected to the redistribution lines are arrayed are different according to the interposing bridges.

16. The semiconductor package of claim 15, wherein the number of the stack modules is equal to the number of the interposing bridges included in each of the stack modules and the number of the semiconductor dies included in each of the stack modules.

17. A semiconductor package comprising:
first to fourth stages of stack modules which are vertically stacked by rotating each of the stack modules by different rotation angles corresponding to multiples of 90 degrees with respect to a rotation axis of the stack modules and by vertically and sequentially stacking the rotated stack modules,
wherein each of the first to fourth stages of stack modules includes:
first to fourth semiconductor dies disposed to have a rim-shaped form;
first to fourth interposing bridges disposed to be adjacent to respective ones of the first to fourth semiconductor dies such that side surfaces of the first to fourth interposing bridges face side surfaces of the first to fourth semiconductor dies; and
redistribution lines connecting the first to fourth of semiconductor dies to respective ones of the first to fourth of interposing bridges,
wherein each of the first to fourth interposing bridges includes:
an interposing bridge body; and
through vias disposed to penetrate the interposing bridge body and arrayed in first to fourth columns,
wherein if the first to fourth interposing bridges are rotated by 90 degrees with respect to the rotation axis, then the rotated first to fourth interposing bridges overlap with the first to fourth interposing bridges which are originally located, wherein the redistribution lines are disposed to connect the first to fourth interposing bridges to respective ones of the first to fourth semiconductor dies, and wherein the columns in which the through vias connected to the redistribution lines are arrayed are different according to the interposing bridges.

18. The semiconductor package of claim 17, wherein if the first to fourth semiconductor dies are rotated by 90 degrees with respect to the rotation axis, then the rotated first to fourth semiconductor dies overlap with the first to fourth semiconductor dies that are originally located.

19. The semiconductor package of claim 17, wherein the redistribution lines include:
a first group of redistribution lines connecting the first semiconductor die to the through vias arrayed in the first column of the first interposing bridge;
a second group of redistribution lines connecting the second semiconductor die to the through vias arrayed in the second column of the second interposing bridge;
a third group of redistribution lines connecting the third semiconductor die to the through vias arrayed in the third column of the third interposing bridge; and
a fourth group of redistribution lines connecting the fourth semiconductor die to the through vias arrayed in the fourth column of the fourth interposing bridge.

20. The semiconductor package of claim 17,
wherein the through vias included in the first to fourth stack modules are vertically stacked to overlap with each other and are vertically connected to each other; and
wherein one of the redistribution lines is connected to only one of the through vias that vertically overlap with each other.

* * * * *